(12) United States Patent
Estes

(10) Patent No.: US 9,444,397 B2
(45) Date of Patent: *Sep. 13, 2016

(54) INTEGRATED SOLAR PANEL

(71) Applicant: SunCulture Solar, Inc., Mountain View, CA (US)

(72) Inventor: Christopher A. Estes, Nashville, TN (US)

(73) Assignee: SunCulture Solar, Inc., Mountain View, CA (US)

( * ) Notice: Subject to any disclaimer, the term of this patent is extended or adjusted under 35 U.S.C. 154(b) by 549 days.

This patent is subject to a terminal disclaimer.

(21) Appl. No.: 13/843,573

(22) Filed: Mar. 15, 2013

(65) Prior Publication Data

US 2014/0116492 A1 May 1, 2014

Related U.S. Application Data

(60) Provisional application No. 61/719,140, filed on Oct. 26, 2012.

(51) Int. Cl.
*H02S 40/30* (2014.01)
*H01L 31/02* (2006.01)
*H02J 3/38* (2006.01)
(Continued)

(52) U.S. Cl.
CPC ......... *H02S 40/30* (2014.12); *H01L 31/02021* (2013.01); *H02J 3/383* (2013.01); *H02S 40/38* (2014.12); *Y02E 10/563* (2013.01)

(58) Field of Classification Search
CPC ........................................................ H02J 1/10
USPC ............................................................ 307/43
See application file for complete search history.

(56) References Cited

U.S. PATENT DOCUMENTS

| 5,977,659 A | 11/1999 | Takehara et al. |
| 8,242,634 B2 | 8/2012 | Schatz et al. |
| 2002/0038667 A1 | 4/2002 | Kondo et al. |

(Continued)

FOREIGN PATENT DOCUMENTS

| DE | 40 32 569 A1 | 4/1992 |
| EP | 1 746 713 A1 | 1/2007 |

(Continued)

OTHER PUBLICATIONS

International Search Report and Written Opinion issued in International Patent Application No. PCT/US2014/028723, dated Sep. 23, 2014, 18 pages.

(Continued)

*Primary Examiner* — Robert Deberadinis
(74) *Attorney, Agent, or Firm* — Wood Herron & Evans LLP

(57) ABSTRACT

A solar panel is disclosed that can be daisy-chained with other solar panels. The solar panel automatically generates output alternative current (AC) power that is in parallel with input AC power coming into the solar panel when the solar panel senses the input AC power so that the solar panel operates as a slave in this state. The solar panel automatically generates standalone AC output power when the solar panel fails to detect input AC power coming into the solar panel where the solar panel operates as a master in this state. The solar panel generates the standalone output AC power without any reliance on input AC power generated by a utility grid and/or other AC power sources external to the solar panel.

20 Claims, 8 Drawing Sheets

(51) Int. Cl.
*H02S 40/38* (2014.01)
*H02J 1/10* (2006.01)

(56) References Cited

U.S. PATENT DOCUMENTS

| | | |
|---|---|---|
| 2004/0031219 A1 | 2/2004 | Banister |
| 2008/0084117 A1 | 4/2008 | Sander et al. |
| 2008/0283118 A1 | 11/2008 | Rotzoll et al. |
| 2010/0043781 A1 | 2/2010 | Jones et al. |
| 2010/0088970 A1 | 4/2010 | Miller |
| 2011/0005567 A1 | 1/2011 | VanderSluis et al. |
| 2011/0060474 A1 | 3/2011 | Schmiegel et al. |
| 2011/0080044 A1 | 4/2011 | Schmiegel |
| 2011/0083733 A1 | 4/2011 | Marroquin et al. |
| 2011/0303262 A1 | 12/2011 | Wolter |
| 2012/0023841 A1 | 2/2012 | Renna |
| 2012/0031488 A1 | 2/2012 | Kaufman et al. |
| 2012/0037222 A1 | 2/2012 | Chan et al. |
| 2012/0085384 A1 | 4/2012 | Beitel et al. |
| 2012/0091810 A1 | 4/2012 | Aiello et al. |
| 2012/0104872 A1 | 5/2012 | Marroquin et al. |
| 2012/0173034 A1 | 7/2012 | Taima |
| 2012/0175964 A1 | 7/2012 | Yoscovich et al. |
| 2012/0182670 A1 | 7/2012 | Prax et al. |
| 2012/0313443 A1 | 12/2012 | Cheng et al. |
| 2012/0315787 A1 | 12/2012 | Wiest et al. |
| 2013/0012061 A1 | 1/2013 | Rotzoll et al. |
| 2013/0014455 A1 | 1/2013 | Grieco |
| 2013/0234645 A1 | 9/2013 | Goei et al. |
| 2013/0241485 A1 | 9/2013 | Snyder |
| 2013/0268436 A1 | 10/2013 | Snidow |

FOREIGN PATENT DOCUMENTS

| | | |
|---|---|---|
| EP | 2874264 A1 | 5/2015 |
| JP | H11 89096 A | 3/1999 |
| WO | 2008/124144 A1 | 10/2008 |
| WO | 2015010442 A1 | 1/2015 |

OTHER PUBLICATIONS

Office Action issued in U.S. Appl. No. 14/484,488, dated Jul. 2, 2015, 6 pages.

International Search Report and Written Opinion issued in International Patent Application No. PCT/US2015/049933, mailed Feb. 15, 2016, 19 pages.

International Search Report and Written Opinion issued in International Patent Application No. PCT/US15/28222, mailed Aug. 5, 2015, 11 pages.

INTEGRATED SOLAR PANEL

CROSS-REFERENCE TO RELATED APPLICATIONS

The present application claims the benefit of U.S. Provisional Patent Appl. No. 61/719,140, filed Oct. 26, 2012, which is incorporated herein by reference in its entirety.

BACKGROUND

1. Field of Disclosure

The present disclosure relates generally to solar power personal energy delivery and specifically to solar power renewable energy devices.

2. Related Art

Conventional solar panel systems have evolved from dependency on the collective conversion of solar energy to direct current (DC) power to reliance on other power sources when conditions limit the collection of solar energy required to adequately support the conventional systems. Conventional solar panel systems of today can now generate alternative current (AC) power when connected to a utility grid. Conventional solar panel systems that are grid tied convert the AC power generated by the utility grid into AC output power for the conventional systems. Thus, conventional solar panel systems are no longer dependent on the DC power collected from the conversion of solar energy to adequately sustain the output power generated by the conventional solar panel systems.

Conventional solar panel systems can also increase the output power of the conventional systems by daisy chaining additional conventional solar panels to the existing conventional solar panels included in the conventional systems. Conventional daisy chaining of conventional solar panels increases the AC output power of the conventional solar panel system when the conventional system is connected to the grid and receiving the AC power generated by the grid. Conventional daisy chaining of conventional solar panels also increases the DC output power of the conventional solar panel system when the conventional system is isolated from the grid and not receiving the AC power generated by the grid. Each of the components included in the conventional solar panel systems are separate entities and not included within a single housing. For example, a conventional solar panel system for a house includes the conventional solar panels located on the roof of the house while the conventional battery system is located in the basement of the house and the conventional inverter is located on the side of the house.

Conventional solar panel systems are limited to generating AC output power when the conventional system is connected to the grid and receiving the AC power generated by the grid. Conventional solar panel systems cannot generate AC power when isolated from the grid or cut off from the AC power generated by the grid. Conventional solar panel systems are limited to generating DC output power when isolated from the grid or cut off from the AC power generated by the grid. The DC output power is limited to DC power stored in batteries or DC power converted from solar energy. Further, the DC output power is inaccessible DC power in that the DC output power cannot be accessed from the conventional solar panel systems. For example, the conventional solar panel systems fail to include a DC output power outlet in which the DC output can be accessed.

BRIEF DESCRIPTION OF THE DRAWINGS/FIGURES

Embodiments of the present disclosure are described with reference to the accompanying drawings. In the drawings, like reference numerals indicate identical or functionally similar elements. Additionally, the left most digit(s) of a reference number identifies the drawing in which the reference number first appears.

Figure 1:
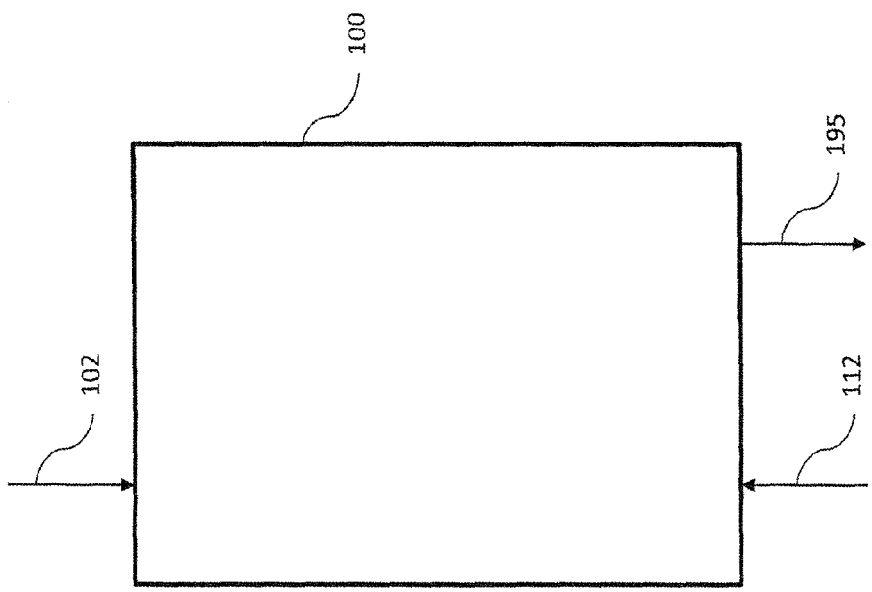
FIG. 1 illustrates a block diagram of a first exemplary solar panel according to an exemplary embodiment of the present disclosure.

The present disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE PRESENT DISCLOSURE

The following Detailed Description refers to accompanying drawings to illustrate exemplary embodiments consistent with the present disclosure. References in the Detailed Description to "one exemplary embodiment", "an exemplary embodiment", an "example exemplary embodiment", etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic may be described in connection with an exemplary embodiment, it is within the knowledge of those skilled in the art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the present disclosure. Therefore, the Detailed Description is not meant to limit the present disclosure. Rather, the scope of the present disclosure is defined only in accordance with the following claims and their equivalents.

Embodiments of the present disclosure may be implemented in hardware, firmware, software, or any combination thereof. Embodiments of the present disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical optical, acoustical or other forms of propagated signals (e.g., carrier waves, infrared signals, digital signals, etc.), and others. Further firmware, software routines, and instructions may be described herein as performing certain actions. However, it should be appreciated that such descriptions are merely for convenience and that such actions in fact result from computing devices, processors, controllers, or other devices executing the firmware, software, routines, instructions, etc.

For purposes of this discussion, each of the various components discussed may be considered a module, and the term "module" shall be understood to include at least one of software, firmware, and hardware (such as one or more circuit, microchip, or device, or any combination thereof), and any combination thereof. In addition, it will be understood that each module may include one, or more than one, component within an actual device, and each component that forms a part of the described module may function either cooperatively or independently of any other component forming a part of the module. Conversely, multiple modules described herein may represent a single component within an actual device. Further, components within a module may be in a single device or distributed among multiple devices in a wired or wireless manner.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the spirit and scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

A First Exemplary Solar Panel

FIG. 1 illustrates a block diagram of a first exemplary solar panel according to an exemplary embodiment of the present disclosure. A solar panel 100 may be a standalone alternating current (AC) power generating device. The solar panel 100 is not limited to generating output AC power 195 by passing through input AC power 112 received from a utility grid into the output AC power 195 when the solar panel 100 is coupled to the utility grid. Rather, the solar panel 100 may still generate standalone output AC power 195 when isolated from the utility grid and not receiving the input AC power 112 from the utility grid. Further, the solar panel 100 may parallel the AC output power 195 generated from the inverted DC power provided by the DC battery with the input AC power 112 when the AC power 195 is synchronized with the input AC power 112.

The solar panel 100 may receive input AC power 112. The input AC power 112 may be AC power that is generated by the grid. The solar panel 100 may receive the input AC power 112 generated by the grid when the solar panel 100 is coupled to the grid. One of ordinary skill in the art may refer to the state of the solar panel 100 as being grid tied when the solar panel 100 is coupled to the grid and receives the input AC power 112 generated by the grid. One of ordinary skill in the art may refer to the state of the solar panel 100 as not being grid tied when the solar panel 100 is isolated from the grid. The input AC power 112 may also be AC power generated by a second solar panel when the solar panel 100 is coupled to the second solar panel. The input AC power 112 may also be AC power generated by an AC power generator, AC power inverter, a sinusoidal AC power inverter, and/or any other type of AC power source independent from the solar panel 100 that will be apparent to those skilled in the relevant art(s) without departing from the spirit and scope of the disclosure.

The solar panel 100 may generate the output AC power 195 that is in parallel with the input AC power 112 when the output AC power 195 is synchronized with the input AC power 112. The solar panel 100 may sense the input AC power 112 when the solar panel 100 is grid tied. The solar panel 100 may also sense the input AC power 112 when the solar panel is coupled to the second panel and the second panel is providing the input AC power 112 to the solar panel 100. The solar panel 100 may synchronize the output AC power 195 generated from the input AC power 112 to be substantially equivalent to the power signal characteristics of the input AC power 112. The power signal characteristics may include but are not limited to frequency, phase, amplitude, current, voltage and/or any other characteristic of a power signal that will be apparent to those skilled in the relevant art(s) without departing from the spirit and scope of the disclosure. The solar panel 100 may store the power signal characteristics of the input AC power 112.

The output AC power 195 generated by the solar panel 100 may be AC power that may be used to power electronic devices external to the solar panel 100, such as a hairdryer, for example. The output AC power 195 may also be AC power that may be provided to a third solar panel. The solar panel 100 may also convert the input AC power 112 to DC power and store the DC power internally to the solar panel 100 when the solar panel is receiving the input AC power 112 but not providing the output AC power 195 to the external electronic devices and/or the third solar panel.

The solar panel 100 may continue to provide standalone output AC power 195 after the solar panel 100 is no longer receiving the AC input power 112 thus the solar panel 100 is not reliant on any other source to generate the standalone output AC power 195. For example, the solar panel 100 continues to provide standalone output AC power 195 after the solar panel is no longer grid tied such that the solar panel 100 is no longer receiving the AC input power 112 from the grid. In another example, the solar panel 100 continues to provide standalone output AC power 195 after the solar panel 100 is no longer receiving the AC input power 112 from the second solar panel.

The solar panel 100 may sense when the solar panel 100 is no longer receiving the AC input power 112. The solar panel 100 may then internally generate the standalone output AC power 195 from the previously stored DC power by the solar panel 100. For example, the solar panel 100 may have previously stored DC power that was converted from the input AC power 112 when the solar panel 100 was receiving the input AC power 112. In another example, the solar panel 100 may also have previously stored the DC power that was converted from the solar energy 102 captured by the solar panel 100.

The solar panel 100 may internally generate the standalone output AC power 195 by converting the previously stored DC power into the AC output power 195. In an embodiment, the solar panel 100 may synchronize the power signal characteristics of the standalone AC output power 195 that was converted from the previously stored DC power to be substantially equivalent to the power signal characteristics of the input AC power 112. The solar panel 100 may internally generate the standalone output AC power 195 that is in parallel with the input AC power 112 when the output AC power 195 is in parallel with the input AC power 112. For example, the solar panel 100 synchronizes the standalone AC output power 195 that was converted from the previously stored DC power to have substantially equivalent frequency, phase, amplitude, voltage and/or current as the input AC power 112 when the solar panel was receiving the input AC power 112. Thus, the solar panel 100 provides the standalone output AC power 195 in parallel with the input AC power 112 when the solar panel 100 is no longer receiving the input AC power 112 while providing such standalone AC output power 195 with substantially similar power signal characteristics of the input AC power 112.

The solar panel 100 may be scalable in size and may be able to provide various levels of output power. For example, the solar panel 100 may be a portable model that may output approximately 250 W. In another example, the solar panel 100 may be a permanent rooftop model that may output 2.5 kW.

The solar panel 100 may also be efficient. The solar panel 100 may include each of the necessary components required to generate the output AC power 195 within a single housing for the solar panel 100. For example, as will be discussed in more detail below, the solar power collector, battery bank, DC to AC converter, controller, and/or each other necessary component required to generate the output AC power 195 may be housed within a single housing for the solar panel 100. The housing of each necessary component within the single housing for the solar panel 100 minimizes the amount of cabling required for the solar panel 100 so that transmission loss from the cabling is minimized.

The solar panel 100 may also be relatively user friendly in that an individual may find that operating the solar panel 100 requires relatively minimal effort for the individual. For example, as will be discussed in more detail below, the individual simply plugs in an external electrical device into the outlet provided by the solar panel 100 to power the external electrical device. In another example, the individual simply plugs in an additional solar panel into the outlet provided by the solar panel 100 to daisy chain the additional solar panel to the solar panel 100. In yet another example, the solar panel 100 that is daisy chained to the additional solar panel automatically establish a master slave relationship so that the individual is not required to manually designate the master and the slave.

An Exemplary Solar Panel Configuration

Figure 2:
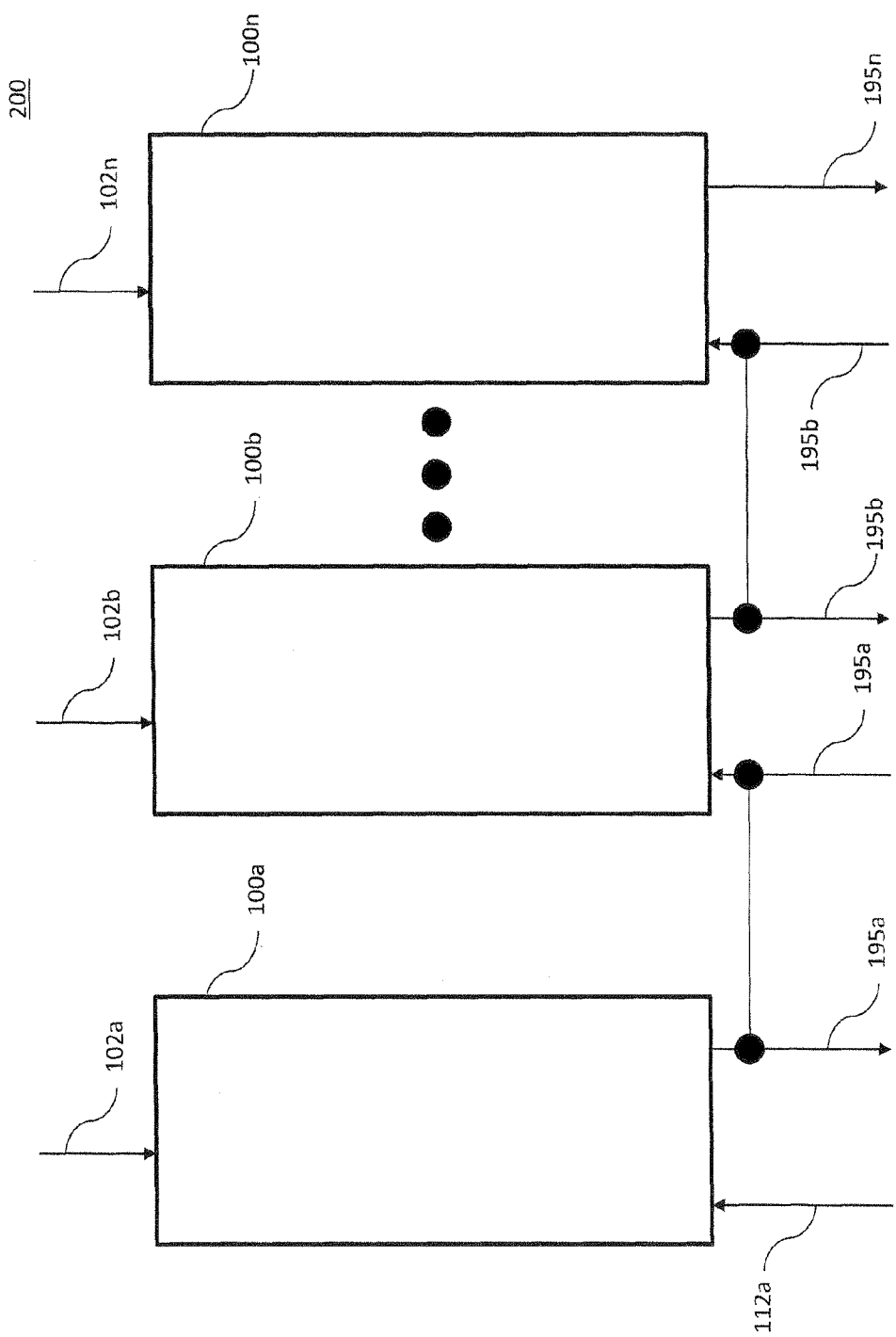
FIG. 2 illustrates a block diagram of a solar panel configuration according to an exemplary embodiment of the present disclosure.

FIG. 2 illustrates a block diagram of a solar panel configuration according to an exemplary embodiment of the present disclosure. The solar panel configuration 200 represents a solar panel configuration that includes a plurality of solar panels 100a through 100n that may be daisy chained together to form the solar panel configuration 200, where n is an integer greater than or equal to two. Each solar panel 100a through 100n that is added to the solar panel configuration 200 may generate the output AC power 195n that is in parallel with the output AC power 195a and the output AC power 195b of the solar panel configuration 200. The solar panel configuration 200 shares many similar features with the solar panel 100; therefore, only the differences between the solar panel configuration 200 and the solar panel 100 are to be discussed in further detail.

As noted above, the solar panel 100a generates the output AC power 195a. However, the solar panel 100a may be limited to a maximum output power level for the output AC power 195a. For example, the solar panel 100a is limited to the maximum output power level of 500 Watts (W) for the output AC power 195a. Regardless of the input power level of the input AC power 112a, the maximum output AC power 195a for the solar panel 100a is 500 W. However, an individual desires to power a hair dryer that requires 1500 W to operate. The solar panel 100a cannot power the hair dryer with the maximum output AC power 195 of 500 W.

Additional solar panels 100b through 100n may be daisy chained to the solar panel 100a to parallel the output AC power 195a so that the overall output power of the solar panel configuration 200 is increased. In daisy chaining the plurality of solar panels 100a through 100n, each power input for each solar panel 100b through 100n is coupled to a power output of a solar panel 100b through 100n that is ahead of the solar panel 100b through 100n in the daisy chain configuration. For example, the power input of the solar panel 100b is coupled to the power output of the solar panel 100a so that the input AC power 195a received by the solar panel 100b is substantially equivalent to the output AC power 195a of the solar panel 100a. The power input of the solar panel 100n is coupled to the power output of the solar panel 100b so that the input AC power 195b received by the solar panel 100n is substantially equivalent to the output AC power 195b of the solar panel 100b.

After daisy chaining each of the plurality of solar panels 102a through 102n, each output AC power 195a through 195n may be paralleled with each input AC power 112b, 195a, and/or 195b to increase the overall output AC power of the solar configuration 200. The output AC power 195n generated by the last solar panel 102n in the daisy chain of the solar configuration 200 may be increased relative to the output AC power 195a generated by the first solar panel 102a in the daisy chain of the solar configuration 200. For example, the maximum output AC power 195a for the solar panel 100a is 500 W. The maximum output power that can be generated by the solar panel 100b is also 500 W. However, the solar panel 102b is daisy chained to the solar panel 102a so that the AC input power 195a for solar panel 102b is in parallel with the AC output power 195b of the solar panel 102b. The output AC power 195a for the solar panel 102b is 500 W. The solar panel 102b generates a maximum output AC power of 500 W in parallel with the input AC power 195a of 500 W to generate the output AC power 195b of 1000 W. The solar panel 102n is daisy chained to the solar panel 102b in a substantially similar manner to generate the output AC power 195n of 1500 W. The output AC power 195n of 1500 W is now sufficient to power the hair dryer that requires 1500 W to operate. The daisy chaining of each of the plurality of solar panels 102a through 102n when the plurality of solar panels 102a through 102n are not grid tied but generating standalone output AC power 195n may be considered a standalone solar micro grid.

Each of the solar panels 100a through 100n included in the solar panel configuration 200 may operate in a master/ slave relationship with each other. The master may be the originator of the standalone AC power for the solar panel configuration 200. The master may determine the power signal characteristics of the standalone AC power originated by the master in that each of the remaining slaves included in the solar panel configuration 200 may be required to synchronize each of their own respective AC power outputs to power signal characteristics by the master. Each respective AC power output that is synchronized to the standalone AC power originated of the master may be paralleled with the standalone AC power for the master. For example, the utility grid is the master of the solar panel configuration 200 when the utility grid is the originator of the input AC power 112a provided to the solar panel 100a. The utility grid determines the frequency, phase, amplitude, voltage and current for the input AC power 112a. Each solar panel 100a through 100n then become a slave and synchronizes each of their respective output AC power 195a through 195n to have substantially equivalent frequency, phase, amplitude, and current as the input AC power 112a. Each output AC power 195a through 195 that is synchronized with input AC power 112a is paralleled with the input AC power 112a.

Each of the solar panels 100a through 100n may operate as a slave for the solar panel configuration 200 when each of the solar panels 100a through 100n is receiving input AC power. Each of the solar panels 100a through 100n may operate as a master when each of the solar panels 100a through 100n no longer receives input AC power. For example, each of the solar panels 100a through 100n operate as the slave when the solar panel configuration 200 is grid tied so that the utility grid operates as the master for the solar panel configuration 200. Each of the solar panels 100a through 100n is receiving input AC power via input AC power. The solar panel 100a is receiving the input AC power 112a from the grid making the solar panel 100a the slave while the solar panel 100b receives the input AC power 195a from the solar panel 100a making the solar panel 100b the slave and the solar panel 100c receives the input AC power 195b from the solar panel 100b making the solar panel 100c the slave.

In another example, the solar panel 100a operates as the master for the solar panel configuration 200 when the solar panel configuration 200 is no longer grid tied and the solar panel 100a is generating the standalone output AC power 195a. Each of the solar panels 100b through 100n is receiving input AC power via the standalone output AC power 195a internally generated by the master solar panel 100a. The solar panel 100b receives the input AC power 195a from the solar panel 100a and the solar panel 100c receives the input AC power 195b from the solar panel 100b.

The solar panel configuration 200 may automatically transition the master/slave designations between each of the solar panels 100a through 100n without user intervention. As noted above, the solar panel 100a through 100n may be designated as the master of the solar panel configuration 200 when the solar panel 100a through 100n no longer receives input AC power. However, the master solar panel 100a through 100n may automatically transition to the slave when the master solar panel 100a through 100n senses input AC power coming into the master solar panel 100a through 100n. At that point, the solar panel 100a through 100b may automatically terminate the internal generation of its own standalone output AC power from its own previously stored DC power. The solar panel 100a through 100n may automatically synchronize to the power signal characteristics of the input AC power now being received by the solar panel 100a through 100b to parallel the output AC power generated by each solar panel 100a through 100b with input AC power. The solar panel 100a through 100n is no longer a master and transitions to a slave begins generating output AC power from the input AC power now being received by it.

For example, the solar panel 100b operates as a master. The solar panel 100b is not receiving input AC power but is internally generating its own standalone output AC power 195b from its own previously stored DC power. The solar panel 100b continues to operate as the master until the solar panel 100b senses input AC power 195a now being received by the solar panel 100b. The solar panel 100a is now coupled to the solar panel 100b and is generating the input AC power 195a now being received by the solar panel 100b. The solar panel 100b then automatically terminates internally generating its own standalone output AC power 195b from its own previously stored DC power. The solar panel 100b automatically synchronizes the standalone output AC power 195b to the frequency, phase, amplitude, and current of the input AC power 195a now being received from the solar panel 100a to parallel the standalone output AC power 195b to the input AC power 195a. The solar panel 100b then transitions to the slave when the solar panel 100b generates the output AC power 195b from the input AC power 195a rather than its own previously stored DC power.

The solar panel configuration 200 may also automatically transition the slave solar panels 100a through 100n to a master without user intervention. As noted above, the solar panels 100a through 100n may be designated as the slave of the solar panel configuration 200 when the solar panels 100a through 100n are receiving input AC power. However, the slave solar panels 100a through 100n may automatically transition to the master when the slave solar panels 100a through 100n no longer senses input AC power coming into the slave solar panels 100a through 100n. At that point, the solar panels 100a through 100n may automatically begin internally generating their own standalone output AC power from their own previously stored DC power. The solar panels 100a through 100n may have stored the power signal characteristics of the input power previously received by the solar panels 100a through 100n. The solar panels 100a through 100n may automatically synchronize their own standalone output AC power to the input AC power no longer received by the solar panels 100a through 100n based on the stored power signal characteristics to parallel the standalone output AC power to the input AC power. The solar panels 100a through 100b are no longer slaves and transitions to a master when the solar panels 100a through 100b begin internally generating their own standalone output AC power from their own previously stored DC power.

The solar panel configuration 200 may continue to generate output AC power despite when the slave solar panels 100a through 100n are no longer functional. The dysfunctional slave solar panels 100a through 100n may continue to pass through the standalone output AC power generated by the master solar panels 100a through 100n to each of the other slave solar panels 100a through 100n. For example, the master solar panel 100a acts as the master and the solar panels 100b and 100n act as the slaves. If the slave solar panel 100b fails and is no longer functional, the dysfunctional slave solar panel 100b continues to pass through the output standalone AC power 195a generated by the master solar panel 100a to the functional slave solar panel 100n so that the functional slave solar panel 100n continues to generate the output AC power 195n from the standalone output AC power 195a.

A Second Exemplary Solar Panel

Figure 3:
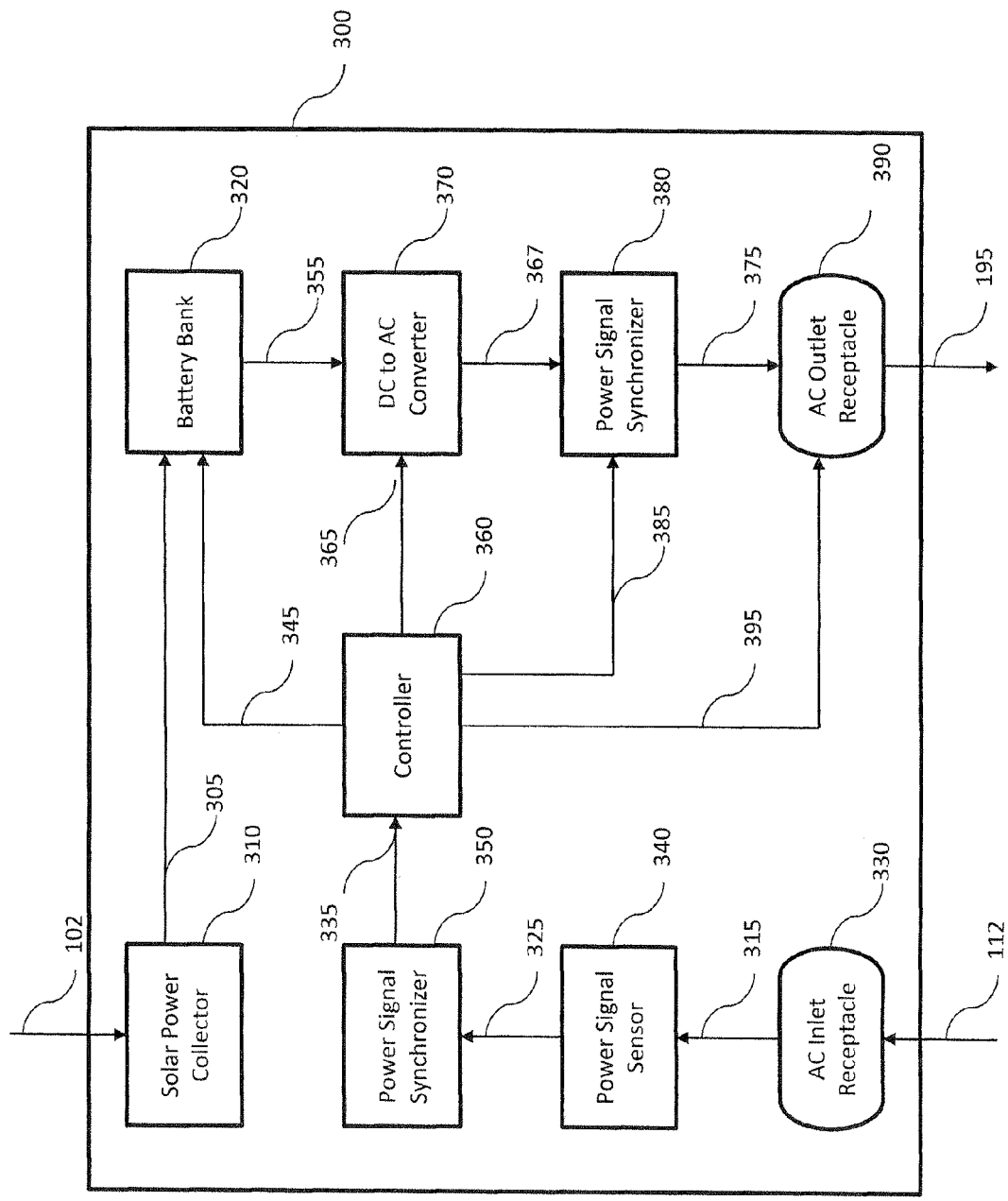
FIG. 3 is a block diagram of a second exemplary solar panel that may be used in the solar panel configuration according to an exemplary embodiment of the present disclosure.

FIG. 3 is a block diagram of a second exemplary solar panel 300 that may be used in the solar panel configuration 200 according to an exemplary embodiment of the present disclosure. Although, FIG. 3 depicts a block diagram of the solar panel 300, one of ordinary skill in the art will recognize that FIG. 3 may also depict a block diagram of the plurality of solar panels 100a through 100n used in the solar panel configuration 200 depicted in FIG. 2 and also the solar panel 100 depicted in FIG. 1. The solar panel 300 may automatically transition to internally generating standalone output AC power 195 based on the stored DC power 355 provided by the battery bank 320 when the power signal sensor 340 no longer senses the received input AC power 315. The solar panel 300 may also automatically transition to operating as a master when the power signal sensor 340 no longer senses the received input AC power 315. The solar panel 300 may also automatically transition to operating as a slave when the power signal sensor 340 begins to sense the received input AC power 315.

The solar panel 300 may be implemented using a solar power collector 310, a battery bank 320, an AC inlet receptacle 330, a power signal sensor 340, a power signal synchronizer 350, a controller 360, a direct current (DC) to AC converter 370, a power signal synchronizer 380, and an AC outlet receptacle 390. Each of which are enclosed within a housing for the solar panel 300. The solar panel 300 shares many similar features with the solar panel 100 and the plurality of solar panels 100a through 100n; therefore, only the differences between the solar panel 300 and the solar panel 100 and the plurality of solar panels 100a through 100n are to be discussed in further detail.

Solar panel collector 310 captures the solar energy 102 from a solar source. The solar panel collector 310 may include a single and/or multiple photovoltaic solar panels that convert the solar energy 102 into the captured DC power 305. The solar panel collector 310 may capture the solar energy 102 when the solar source is available and is radiating the solar energy 102 in a sufficient manner for the solar panel collector 310 to capture. The solar panel collector 310 may convert the solar energy 102 into the DC captured power 305 in a wide range of voltages and/or current capacities. The solar panel collector 310 may include photovoltaic solar panels categorized as but not limited to mono-crystalline silicon, poly-crystalline silicon, amorphous silicon, cadmium telluride, copper indium selenide, thin-film layers, organic dyes, organic polymers, nanocrystals and/or any other type of photovoltaic solar panels that will be apparent to those skilled in the relevant art(s) without departing from the spirit and scope of the disclosure. The solar panel collector 310 may also be any shape and/or size that are sufficient to capture the solar energy 102 that will be apparent to those skilled in the relevant art(s) without departing from the spirit and scope of the disclosure.

The battery bank 320 receives and stores the captured DC power 305. The battery bank 320 accumulates the captured DC power 305 as the captured DC power 305 is generated. The battery bank 320 may accumulate the captured DC power 305 until the battery bank 320 is at capacity and can no longer store any more of the captured DC power 305. The battery bank 320 may also store the AC input power 112 that is converted to the captured DC power 305 when the AC output receptacle 390 is not generating the output AC power 195. The battery bank 320 stores the captured DC power 305 until requested to provide the stored DC power 355. The stored DC power 355 provided by the battery bank 320 may include low-voltage but high energy DC power. The battery bank 320 may include one or more lithium ion phosphate (LiFePO$_4$) and/or one or more lead acid cells. However, this example is not limiting, those skilled in the relevant art(s) may implement the battery bank 320 using other battery chemistries without departing from the scope and spirit of the present disclosure. The one or more cells of the battery bank 320 convert chemical energy into electrical energy via an electromechanical reaction.

As noted above, the solar panel 300 may automatically transition between the master and/or slave designations without user intervention. The solar panel 300 may be operating as a slave when the AC inlet receptacle 330 is receiving the AC input power 112. The input AC power 112 may be AC power that is generated by the grid. The AC inlet receptacle 330 may receive the input AC power 112 when the AC inlet receptacle 330 is grid tied. The input AC power 112 may also be AC power generated by a second solar panel when the AC inlet receptacle 330 is coupled to the second solar panel. The input AC power 112 may also be AC power generated by an AC power generator, AC power inverter, and/or any other type of AC power source independent from the solar panel 300 that will be apparent to those skilled in the relevant art(s) without departing from the spirit and scope of the disclosure.

The AC inlet receptacle 330 may include a male configuration or a female configuration. In an embodiment, the AC inlet receptacle 330 may include a male configuration so that an individual cannot mistakenly plug an electronic device into the AC inlet receptacle with the intent to power the electronic device. Typically, electronic devices include plugs in male configurations. The AC inlet receptacle 330 may be fuse protected. The AC inlet receptacle 330 may be configured to receive the input AC power 112 in American, European, and/or any other power format that will be apparent to those skilled in the relevant art(s) without departing from the spirit and scope of the disclosure. The AC inlet receptacle 330 may include an Edison plug, any of the several International Electrotechnical Commission (IEC) plugs and/or any other type of plug that will be apparent to those skilled in the relevant art(s) without departing from the spirit and scope of the disclosure.

The AC inlet receptacle 330 may provide received input AC power 315 to a power signal sensor 340. The power signal sensor 340 may sense the solar panel 300 is receiving the input AC power 112 through the AC inlet receptacle 330 based on the received input AC power 315 received from the AC inlet receptacle 330. After the power signal sensor 340 senses the received input AC power 315, the power signal sensor 340 generates an incoming AC power signal 325. The incoming AC power signal 325 provides information regarding power signal characteristics of the input AC power 112 that the solar panel 300 is receiving through the AC inlet receptacle 330. The incoming AC power signal 325 may provide information regarding power signal characteristics of the input AC power 112 that includes but is not limited to frequency, phase, amplitude, current, voltage and/or any other characteristic of a power signal that will be apparent to those skilled in the relevant art(s) without departing from the spirit and scope of the disclosure.

The power signal sensor 340 provides the incoming AC power signal 325 to a power signal synchronizer 350. The power signal synchronizer 350 determines the power signal characteristics of the input AC power 112 that are provided by the incoming AC power signal 325. For example, the power signal synchronizer 350 determines the frequency, phase, amplitude, voltage and/or current of the input AC power 112. The power signal synchronizer 350 generates a synchronized input power signal 335 that provides the power signal characteristics of the input AC power 112 to a controller 360. In an embodiment, the power signal synchronizer 350 determines the power signal characteristics of the input AC power 112 by monitoring the voltage of the incoming AC power signal 325.

The power signal synchronizer 350 also synchronizes the converted AC power 367 that is generated by the DC to AC converter 370 with the power signal characteristics of the input AC power 112. The output AC power 195 includes the input AC power 112 in parallel with the converted AC power 367 when the converted AC power 367 is synchronized with the input AC power 112. For example, the power signal synchronizer 350 synchronizes the converted AC power 367 to operate at a substantially equivalent frequency, phase, amplitude, voltage and/or current of the input AC power 112. In an embodiment, the input AC power 112 embodies a substantially pure sinusoidal waveform. The substantially pure sinusoidal wave may represent an analog audio wave which is substantially smooth and curved rather than a digital audio wave that includes squared off edges. In such an embodiment, the power signal synchronizer 350 synchronizes the converted AC power 367 to be substantially equivalent to the pure sinusoidal wave embodied by the input AC power 112. After the power signal synchronizer 350 synchronizes the converted AC power 367 to the power signal characteristics of the input AC power 112, the power signal synchronizer 350 notifies the controller 360 of the synchronization via the synchronized input power signal 335.

The controller 360 receives the synchronized input power signal 335. The controller 360 determines the power signal characteristics of the input AC power 112 and then stores the power signal characteristics in a memory included in the controller 360. For example, the controller 360 stores the frequency, phase, amplitude, voltage and/or current of the input AC power 112. After receiving the synchronized input power signal 335, the controller 360 is aware that the input AC power 112 is coupled to the AC inlet receptacle 330. In response to the input AC power 112 coupled to the AC inlet receptacle 330, the controller 360 stops generating the reference clock for the solar panel 300.

Also, in response to the input AC power 112 coupled to the AC inlet receptacle 330, the controller 360 also generates a battery bank signal 345. The controller 360 instructs the battery bank 320 via the battery bank signal 345 to no longer provide stored DC power 355 to the DC to AC inverter 370. The instruction by the controller 360 to the battery bank 320 to no longer provide stored DC power 355 to the DC to AC inverter 370 also terminates the standalone output AC power 195 that is generated from the stored DC power 355.

Further, in response to the input AC power 112 coupled to the AC inlet receptacle 330, the controller 360 confirms that the power signal synchronizer 350 has synchronized the converted AC power 367 to the power signal characteristics of the input AC power 112. After confirming that the power signal synchronizer 350 has synchronized the converted AC power 367 to the power signal characteristics of the input AC power 112, the controller 360 links in parallel the input AC power 112 being received by the AC inlet receptacle 330 with the converted AC power 367 to the AC outlet receptacle 390 to generate the parallel AC power 195. The AC outlet receptacle 390 then outputs the output AC power 195 that includes the input AC power 112 in parallel with the converted AC power 367 with power signal characteristics that are substantially equivalent to the power signal characteristics of the input AC power 112. For example, the frequency, phase, amplitude, voltage and/or current of the output AC power 195 may be substantially equivalent to the frequency, phase, amplitude, voltage and/or current of the input AC power 112.

The AC outlet receptacle 390 may include a male configuration or a female configuration. In an embodiment, the AC outlet receptacle 390 may include a female configuration so that an individual can easily plug an electronic device into the AC outlet receptacle 390 with the intent to power the electronic device. Typically, electronic devices include plugs in male configurations. In another embodiment, the AC outlet receptacle 390 may include a configuration that is opposite that of the AC inlet receptacle 330. For example, the AC inlet receptacle 330 may include a male configuration while the AC outlet receptacle 390 includes a female configuration.

The AC outlet receptacle 390 may be fuse protected. The AC outlet receptacle 390 may be configured to provide the output AC power 195 in American, European, and/or any other power format that will be apparent to those skilled in the relevant art(s) without departing from the spirit and scope of the disclosure. The AC outlet receptacle 390 may include an Edison plug, any of the several International Electrotechnical Commission (IEC) plugs and/or any other type of plug that will be apparent to those skilled in the relevant art(s) without departing from the spirit and scope of the disclosure.

As noted above, the solar panel 300 may automatically transition between the master and/or slave designations without user intervention. The solar panel 300 may automatically transition from operating as a slave to operating as a master when the AC input power signal 112 diminishes and is no longer received by the AC inlet receptacle 330. The controller 360 no longer receives the synchronized input power signal 335 providing information regarding the AC input power 112. At that point, the controller 360 generates the battery bank signal 345 to instruct the battery bank 320 to begin generating the stored DC power 355. The controller 360 generates a power conversion signal 365 to instruct the DC to AC converter 370 to convert the stored DC power 355 to converted AC power 367. The converted AC power 367 is high-voltage AC output power. In an embodiment, the DC to AC converter 370 may use high frequency modulation in converting the stored DC power 355 to the converted AC power 367.

The controller 360 then provides a synchronized output power signal 385 to the power signal synchronizer 380. The synchronized output power signal 385 provides the power signal characteristics of the input AC power 112 when the input power signal 112 was coupled to the AC inlet receptacle 330 to the power signal synchronizer 380. For example, the synchronized output power signal 385 provides the frequency, phase, amplitude, voltage and/or current of the input power signal 112 to the power signal synchronizer 380. The synchronized output power signal 385 also provides a reference clock to the power signal synchronizer 380.

The power signal synchronizer 380 then generates synchronized AC output power 375 by synchronizing the converted AC power 367 to the power signal characteristics of the input AC power 112 and the reference clock provided by the synchronized output power signal 385. In an embodiment, the input AC power 112 embodies a substantially pure sinusoidal waveform. In such an embodiment, the power signal synchronizer 380 synchronizes the converted AC power 367 to be substantially equivalent to the pure sinusoidal wave embodied by the input AC power 112. The synchronized AC output power 375 includes power signal characteristics that are substantially equivalent to the power signal characteristics of the input AC power 112. For example, the synchronized AC output power 375 includes a frequency, phase, amplitude, voltage and/or current that is substantially equivalent to the frequency, phase, amplitude, voltage and/or current of the input AC power 112. The AC outlet receptacle 390 then generates the standalone output AC power 195 based on the synchronized output power 375. The standalone output includes the input AC power 112 in parallel with the synchronized AC output power 375. Thus, the solar panel 300 generates the standalone output AC power 195 that is substantially similar to the input AC power 112 despite not being grid tied and/or receiving the input AC power 112 from other sources.

A Third Exemplary Solar Panel

Figure 4:
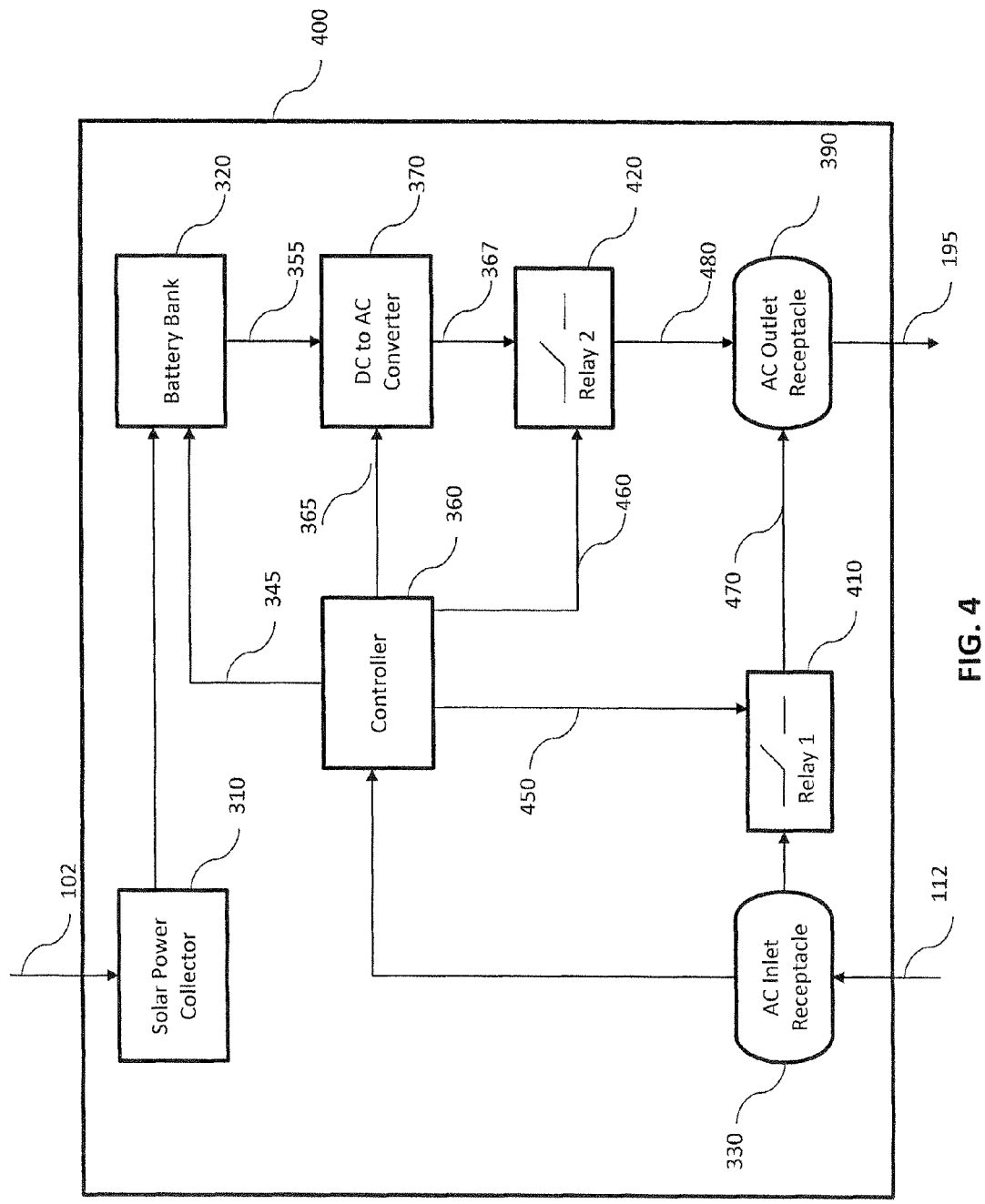
FIG. 4 is a block diagram of a third exemplary solar panel that may be used in the solar panel configuration according to an exemplary embodiment of the present disclosure.

FIG. 4 is a block diagram of a third exemplary solar panel 400 that may be used in the solar panel configuration 200 according to an exemplary embodiment of the present disclosure. Although, FIG. 4 depicts a block diagram of the solar panel 400, one of ordinary skill in the art will recognize that FIG. 4 may also depict a block diagram of the plurality of panels 100a through 100n used in the solar panel configuration 200 depicted in FIG. 2 and also the solar panel 100 depicted in FIG. 1. One of ordinary skill in the art will also recognize that features depicted in the block diagram of the solar panel 300 may also be included in the solar panel 400 but have been omitted for clarity.

The solar panel 400 may automatically transition from operating as a master and operating as a slave without user intervention based on a relay configuration. The transitioning of the relay configuration may automatically transition the solar panel 400 between operating as a master and operating as a slave without user intervention. The solar panel 400 may be implemented using the solar power collector 310, the battery bank 320, the AC inlet receptacle 330, the controller 360, the DC to AC converter 370, the AC outlet receptacle 390, a first relay 410 and a second relay 420. Each of which are enclosed within a housing for the solar panel 400. The solar panel 400 shares many similar features with the solar panel 100, the plurality of solar panels 100a through 100n, and the solar panel 300; therefore, only the differences between the solar panel 400 and the solar panel 100, the plurality of solar panels 100a through 100n, and the solar panel 300 are to be discussed in further detail.

As noted above, the solar panel 400 operates as a slave when the controller 360 senses that the input AC power 112 is coupled to the AC inlet receptacle 330. The controller then terminates the generation of the standalone output AC power 195. The solar panel 400 operates as a master when the controller 360 no longer senses that the input AC power 112 is coupled to the AC inlet receptacle 330. The controller 360 then instructs the battery bank 320 and the DC to AC inverter 370 to begin generating the standalone output AC power 195. The relay configuration that includes a first relay 410 and a second relay 420 transitions the solar panel 400 between the master and slave modes based on the logic provided in Table 1.

TABLE 1

| Master Mode | Relay 1 Open | Relay 2 Closed |
| Slave Mode | Relay 2 Closed | Relay 2 Closed |
| Unit Power Off (Bypassed) | Relay 1 Closed | Relay 2 Open |

When automatically transitioning from the slave mode to the master mode, the controller 360 no longer senses the input AC power 112 coupled to the AC inlet receptacle 330. At this point, the controller 360 generates a first relay signal 450 that instructs the first relay 410 transition to the open state (logic 0). The controller 360 also generates a second relay signal 460 that instructs the second relay 420 to transition to the closed state (logic 1). The controller 360 also generates battery bank signal 345 that instructs the battery bank 320 to begin providing the stored DC power 355 to the DC to AC converter 370 to generate the converted AC power 367. Because the second relay 420 is in the closed position (logic 1), the converted AC power 367 passes through the second relay 420, and as shown by arrow 480, onto the AC outlet receptacle 390 so that the solar panel 400 provides the AC output power 195 generated from the stored DC power 355 rather than the input AC power 112. The open state (logic 0) of the first relay 410 prevents any remaining input AC power 112 from reaching the AC output receptacle 390 when the solar panel 400 is generating the standalone AC output power 195 as operating as the master.

Once the controller 360 senses the input AC power 112 coupled to the AC inlet receptacle 330, the controller 360 automatically generates the battery bank signal 365 to instruct DC to AC converter 370 to no longer provide the converted AC power 367 so that the solar panel 400 no longer generates the standalone AC output power 195. The controller 360 also automatically generates the second relay signal 460 to instruct the second relay 420 to transition to the open state (logic 0). The controller 360 also generates the first relay signal 450 to instruct the first relay 410 to transition to the closed state (logic 1). After the second relay 420 transitions to the open state (logic 0) and the first relay 410 transitions to the closed state (logic 1), any input AC power 112 coupled to the AC inlet receptacle 330 passes through the first relay 410, and as shown by arrow 470, onto to the AC outlet receptacle 390 so that the solar panel 400 generates the output AC power 195.

However, the second relay 420 is still in the open state (logic 0). The controller 360 is not going to instruct the second relay 420 to transition into the closed state (logic 1) until the controller 360 has successfully synchronized the solar panel 400 to the input AC power 112 coupled to the AC inlet receptacle 330. After the controller 360 properly synchronizes solar panel 400 to the input AC power 112, then the controller 360 generates the second relay signal 460 to instruct the second relay 420 to transition from the open state (logic 0) to the closed state (logic 1). After the second relay 420 transitions from the open state (logic 0) to the closed state (logic 1), then the solar panel 400 is generating output AC power 195 that includes the converted AC power 367 that is in parallel to the input AC power 112.

The solar panel 400 also operates in a bypass mode. In the bypass mode, the solar panel 400 is powered off and is no longer functioning. In embodiment, the controller 360 generates the first relay signal 450 and instructs the first relay 410 to transition into the closed state (logic 1). The controller 360 also generates the second relay signal 460 and instructs the second relay 420 to transition into the open state (logic 0). In another embodiment, the first relay 410 and the second relay 420 are spring loaded relay switches. When the solar panel 400 powers off, the electromagnetic coil of the first relay 410 is no longer energized so the spring pulls the contacts in the first relay 410 into the up position. The closing of the first relay 410 and the opening of the second relay 420 cause the solar panel 400 to be a pass through where the input AC power 112 passes through the solar panel 400 and onto a second solar panel daisy chained to the solar panel 400 and/or to an electronic device being powered by the input AC power 112. Thus, additional solar panels and/or electronic devices down the line from the dysfunctional solar panel 400 continue to operate off of the input AC power 112. The first relay 410 and the second relay 420 may be implemented may be implemented in hardware, firmware, software, or any combination thereof that will be apparent to those skilled in the relevant art(s) without departing from the spirit and scope of the disclosure.

A Fourth Exemplary Solar Panel

Figure 5:
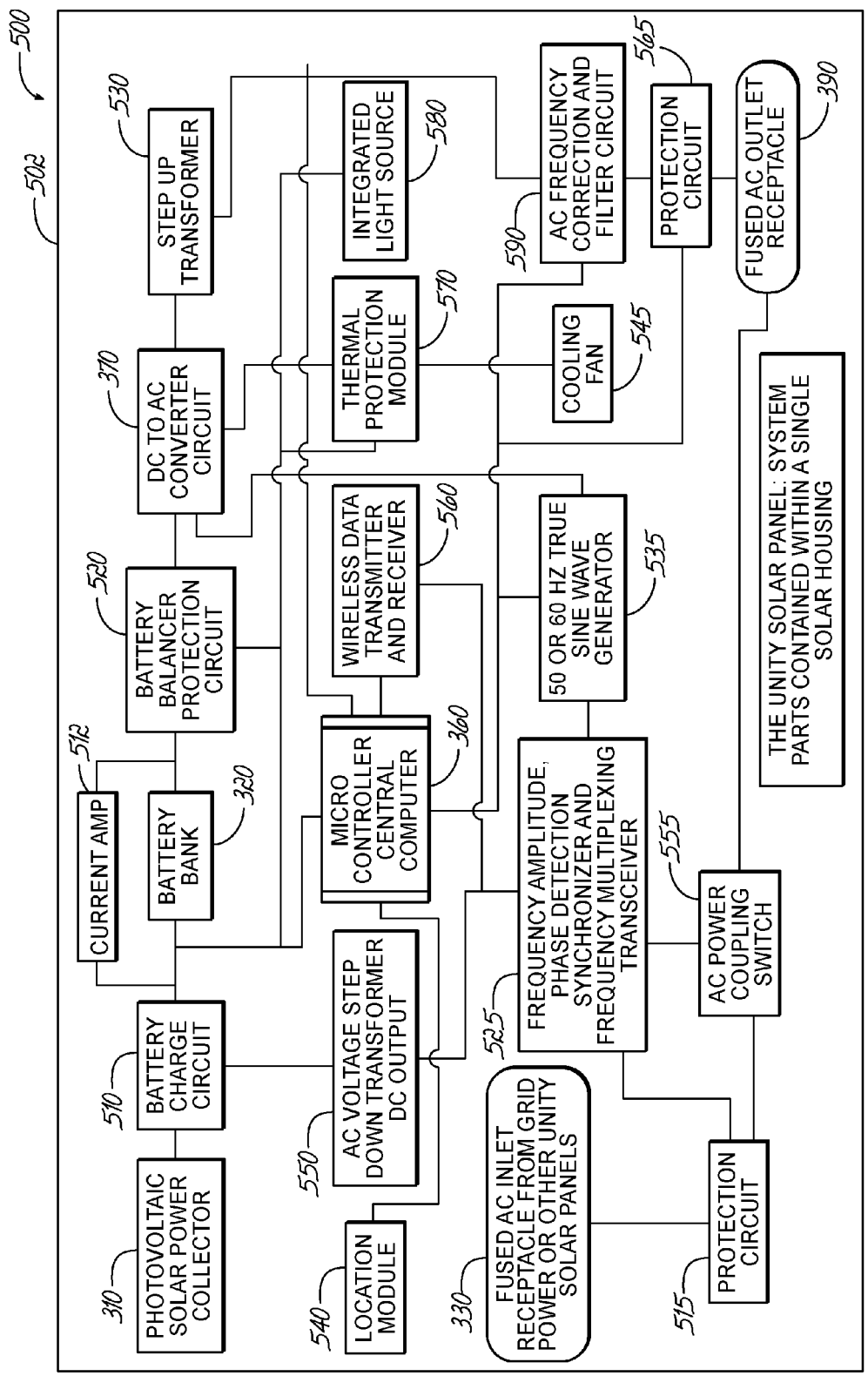
FIG. 5 is a block diagram of a fourth exemplary solar panel that may be used in the solar panel configuration according to an exemplary embodiment of the present disclosure.

FIG. 5 is a block diagram of a fourth exemplary solar panel 500 that may be used in the solar panel configuration 200 according to an exemplary embodiment of the present disclosure. Although, FIG. 5 depicts a block diagram of the solar panel 500, one of ordinary skill in the art will recognize that FIG. 5 may also depict a block diagram of the plurality of panels 100a through 100n used in the solar panel configuration 200 depicted in FIG. 2, and the solar panel 100 depicted in FIG. 1. One of ordinary skill in the art will also recognize that features depicted in the block diagram of the solar panel 300 and 400 may also be included in the solar panel 500 but have been omitted for clarity.

The solar panel 500 may be implemented using the solar power collector 310, a battery charge circuit 510, a current amplifier 512, the battery bank 320, a battery balancer protection circuit 520, a step transformer 530, a location module 540, an AC voltage step down transformer DC output, a wireless data transmitter and receiver 560, a thermal protection module 570, an integrated light source module 580, an AC frequency correction and filter circuit 590, a protection circuit 515, the AC inlet receptacle 330, the controller 360, the DC to AC converter 370, a frequency, amplitude, phase detection synchronizer and frequency multiplexing transceiver 525, a 50 or 60 Hertz (Hz) true sine wave generator 535, a cooling fan 545, a protection circuit 565, an AC power coupling switch 555 and the AC outlet receptacle 390. Each of which is enclosed within a housing 502 for the solar panel 500. The solar panel 500 shares many similar features with the solar panel 100, the plurality of solar panels 100a through 100n, the solar panel 300, and the solar panel 400; therefore, only the differences between the solar panel 500 and the solar panel 100, the plurality of solar panels 100a through 100n, the solar panel 300, and the solar panel 400 are to be discussed in further detail.

The battery charge circuit 510 may include passive and/or active circuitry as well as integrated circuits to control and/or regulate the charging of the battery bank 320 included within the solar panel 500. The battery charge circuit 510 may have bidirectional communication with a computing device, such as controller 360. The controller 360 may also control the battery charge circuit 510. The current amplifier 512 may increase the output current of the solar panel and assist in charging the battery bank 320.

The battery balancer protection circuit 520 is disposed within the housing of the solar panel 500. The battery balancer protection circuit 520 may include passive and/or active circuitry as well as integrated circuits that may be controlled by the controller 360. The battery balancer protection circuit 520 may be used to ensure safe discharge and recharge of the individual cells within the battery bank 320.

The solar panel 500 may further include a location module 540. The location module 540 may include one or several location sensors such as but not limited to a global positioning system (GPS), a compass, a gyroscope, an altitude, and/or any other location sensor digital media file that will be apparent to those skilled in the relevant art(s) without departing from the spirit and scope of the disclosure. The location module 540 may be used to send data to the controller 360 through the wireless data transmitter and receiver 560 to an external personal computing device.

The AC voltage step down transformer 550 is included in the solar panel 500. The step down transformer 550 may be used to charge the battery bank 320 from the AC inlet receptacle 330 through the battery charge circuit 510. The step down transformer 550 may include iron, steel, ferrite or any other materials and fashioned specifically to satisfy power requirements for charging the battery bank 320. The step down transformer 550 may also have a filtered DC output.

As discussed above, the solar panel 500 includes a computing device such as the controller 360. The controller 360 may be used to control and/or monitor the solar panel 500. The controller 360 may be a single or multiple processor based and may be able to receive software and/or firmware updates wirelessly through the associated wireless data transmitter and receiver 560 or through a hardware connection such as the frequency multiplexing transceiver 525. The controller 360 may be connected to any part of the solar panel 500 for central control, remote control, general monitoring, and/or data collection purposes. The wireless data transmitter and receiver 560 may use Bluetooth, Wi-Fi, cellular, and/or any other acceptable radio frequency data transmissions and reception techniques that will be apparent to those skilled in the relevant art(s) without departing from the spirit and scope of the disclosure. The transmitter and receiver 560 may be used to transmit data from the solar panel 500 to one or more external personal computing devices.

The solar panel 500 includes a thermal protection module 570. The thermal protection module 570 includes one or more sensors positioned in one or more locations throughout any part of the solar panel 500 for the purpose of temperature monitoring. The thermal protection module 570 is connected to the controller 360 and may be used to transmit data from the solar panel 500 to external personal computing devices.

As shown, the solar panel 500 may include the integrated light source 580. The integrated light source 580 may include one or more integrated lights inside or disposed on an exterior surface of the housing of the solar panel 500 and may be used as a light source. The integrated lights may vary in color, intensity, temperature, size, frequency, and/or brightness. The integrated light source 580 may be coupled to the controller 560. The integrated light source 580 may be used to transmit data from the solar panel 500 to external personal computing devices.

The solar panel 500 further includes a grid frequency, amplitude, power phase detection synchronizer and frequency multiplexing transceiver 525, which may synchronize multiple AC power sources and transmit data between one or more solar panels 500 via a standard AC power line.

The solar panel 500 further includes a frequency generator, such as a true sine wave generator 535, such as a 50 Hz or 60 Hz true sine wave generator 535. The frequency generator may be other types of generators configured to output a signal at a particular reference frequency. The sine wave generator 535 may provide a sine wave reference to the DC to AC converter 370. The sine wave generator 535 may be coupled to the controller 360 as well as the grid frequency, amplitude, power phase detection synchronizer and frequency multiplexing transceiver 525. Moreover, the sine wave generator 535 may include analog and/or digital circuitry.

The solar panel 500 may further include a cooling fan 545 disposed within the housing of the solar panel 500. The cooling fan 545 may include one or more cooling fans arranged in a way that best ventilates an interior at least partially formed by the housing of the solar panel 500 in which one or more components are disposed. The cooling fan 545 may be coupled to the thermal protection module 570 and/or the controller 360.

Furthermore, the solar panel 500 includes an AC frequency correction and filter circuit 590. The frequency correction and filter circuit 590 may be controlled by the controller 360 through the 50 Hz or 60 Hz true sine wave generator 535. In addition, the frequency correction and filter circuit 590 may receive AC power from the step up transformer 530 and may output corrected and filtered AC power to a protection circuit 515 of the solar panel 500. The protection circuit 515 provides surge and fuse protection and may be controlled and monitored by the controller 360.

Moreover, the solar panel 500 an AC coupling switch 555 that is configured to couple the AC power from the AC inlet receptacle 330 with AC grid equivalent power generated by the solar panel 500 such that synchronized AC power from the AC inlet receptacle 330 and the solar panel 500 are coupled together for output from the AC outlet receptacle 390. The AC coupling switch 555 may be controlled by the controller 360 in conjunction with the grid frequency, amplitude, power phase detection synchronizer and frequency multiplexing transceiver 525.

A Second Exemplary Solar Panel Configuration

Figure 6:
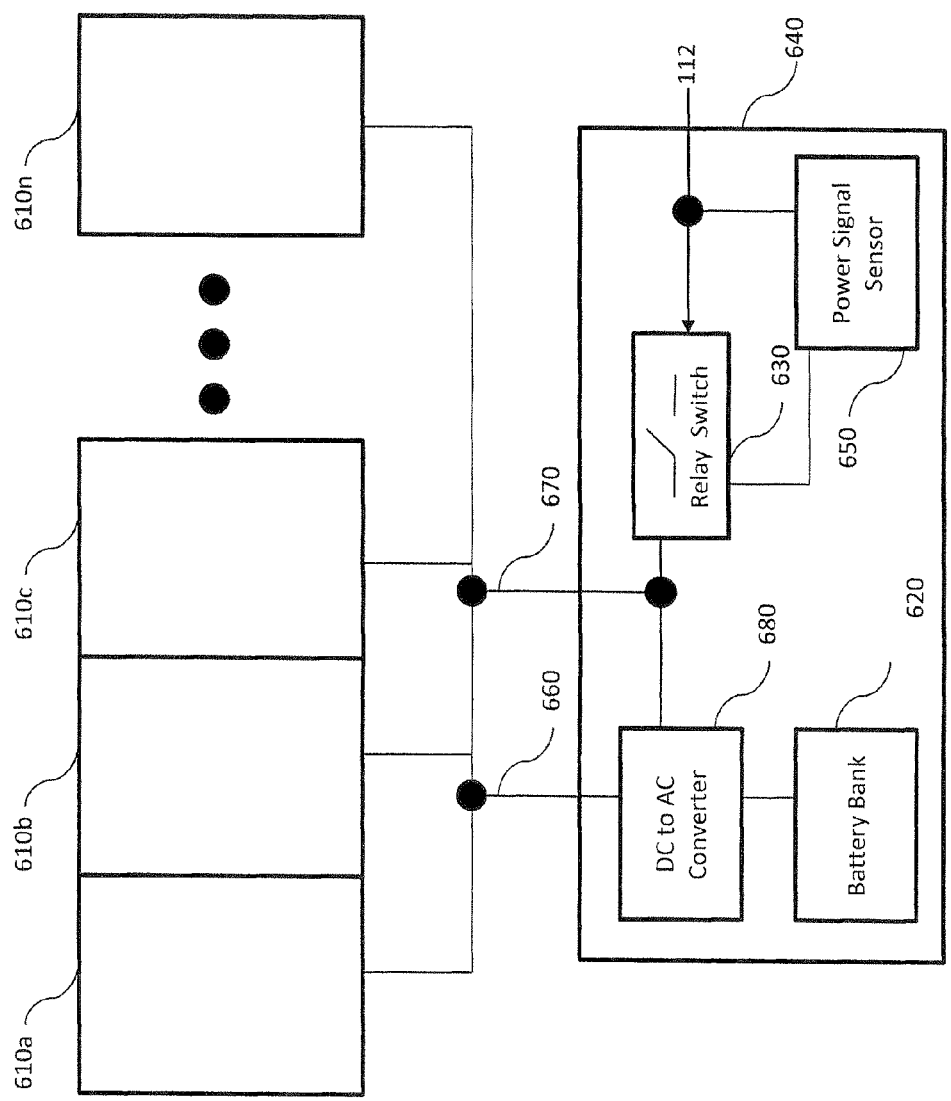
FIG. 6 illustrates a block diagram of a second exemplary solar panel configuration according to an exemplary embodiment of the present disclosure.

FIG. 6 illustrates a block diagram of a second exemplary solar panel configuration according to an exemplary embodiment of the present disclosure. The solar panel configuration 600 represents a solar panel configuration that includes a plurality of solar panels 610*a* through 610*n* that may be daisy chained together and coupled to a grid tie system 640 to form the solar panel configuration 600, where n is an integer greater than or equal to one. The grid tie system 640 monitors the input AC power 112 that is generated by the grid to determine whether the power grid remains stable to generate the input AC power 112. The grid tie system 640 instructs the battery bank 620 to provide converted AC power 660 to the plurality of solar panels 610*a* through 610*n* when the grid tie system 640 determines that the power grid has failed. Thus, the grid-tie system 640 provides back up power to the plurality of solar panels 610*a* through 610*n* when the grid fails.

The grid-tie system 640 includes the battery bank 620, a relay switch 630, a DC to AC converter 680 and a power signal sensor 650. The solar panel configuration 600 shares many similar features with the solar panel 100, the plurality of solar panels 100*a* through 100*n*, the solar panel 300, the solar panel 400, the solar panel 500, and the solar panel configuration 200; therefore, only the differences between the solar panel configuration 600 and the solar panel 100, the plurality of solar panels 100*a* through 100*n*, the solar panel 300, the solar panel 400, the solar panel 500, and the solar panel configuration 200 are to be discussed in further detail.

In an embodiment, the plurality of solar panels 610*a* through 610*n* may include larger solar panels with larger capacities to capture solar energy and convert the captured solar energy into DC power that may be stored in the battery bank 620. The grid tie system 640 may automatically link the plurality of solar panels 610*a* through 610*n* to the input AC power 112 when the grid tie system 640 is grid tied. The grid tie system 640 may also automatically provide the converted AC power 660 to the plurality of solar panels 610*a* through 610*n* when the grid tie system 640 is no longer grid tied such that the input AC power 112 is no longer available to the plurality of solar panels 610*a* through 610*n*.

In an embodiment, the each of the plurality of solar panels 610*a* through 610*n* may be updated as to the status of the grid. For example, the plurality of solar panels 610*a* through 610*n* may be updated when the grid fails via a signal that is transmitted through the AC power line of the grid.

In another embodiment, the grid tie system 640 may control the converted AC power 660 so that the DC power stored in the battery bank 620 is not depleted from the use of the converted AC power 660. For example, the grid tie system 640 may dial back the use of the converted AC power 660 from maximum capacity to conserve the DC power stored in the battery bank 620

The grid tie system 640 includes a relay switch 630. The relay switch 630 transitions into an open state (logic 0) when the grid fails and is no longer providing the input AC power 112 to the grid tie system 640 so that the grid tie system 640 may be substantially disconnected from the grid. The grid tie system 640 immediately instructs the DC to AC converter 680 to convert the DC power stored in the battery bank 620 to begin providing the converted AC power 660 the plurality of solar panels 610*a* through 610*n* to replace the input AC power 112 no longer supplied to the grid tie system 640. The converted AC power 660 may include power signal characteristics that have already been synchronized with the power signal characteristics included in the input AC power 112 before the grid went down. For example, the converted AC power 660 may include a frequency, phase, amplitude, voltage and/or current that are substantially similar to the frequency, phase, amplitude, voltage and/or current of the input AC power 112. As a result, the plurality of solar panels 610*a* through 610*n* fail to recognize that the grid has failed and is no longer providing the input AC power 112 to the grid tie system 640.

After the grid fails, the power signal sensor 650 continues to sense the power signal characteristics on the failed side of the relay switch 630. For example, the power signal sensor 650 continues to sense the voltage, current, frequency, and/or phase on the failed side of the relay switch 630. As the grid begins to come back up, the power signal sensor 650 recognizes that the power signal characteristics on the failed side of the relay switch 630 are beginning to show that the grid is coming back up. As the grid stabilizes, the grid tie system 640 begins to adjust the power signal characteristics of the converted AC power 660 to become substantially equivalent to the power signal characteristics of the input AC power 112 being sensed by the power signal sensor 650. For example, the grid tie system 640 synchronizes the converted AC power 660 so that the frequency, phase, amplitude, voltage and/or current of the converted AC power 660 become substantially equivalent to the frequency, phase, amplitude, voltage and/or current of the of the input AC power 112 being sensed by the power signal sensor 650.

After the power signal characteristics of the converted AC power 660 are substantially equivalent to the power signal characteristics of the input AC power 112, the grid tie system 640 transitions the relay switch 630 into a closed position (logic 1). The plurality of solar panels 610*a* through 610*n* are no longer running off of the converted AC power 660 but are rather running off of the input AC power 112 provided by the grid.

A Wireless Solar Panel Configuration

Figure 7:
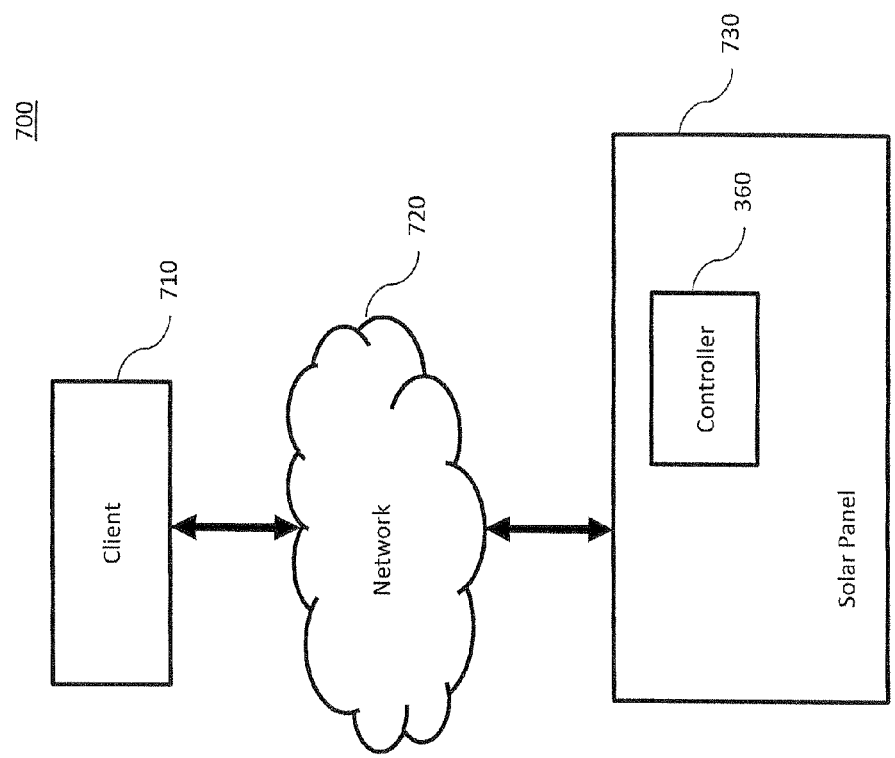
FIG. 7 shows an illustration of a wireless solar panel configuration.

FIG. 7 shows an illustration of a wireless solar panel configuration 700. The wireless solar panel configuration 700 includes a client 710, a network 720, and a solar panel 730.

One or more clients 710 may connect to one or more solar panels 730 via network 720. The client 710 may be a device that includes at least one processor, at least one memory, and at least one network interface. For example, the client may be implemented on a personal computer, handled computer, personal digital assistant, smart phone, a mobile telephone, a game console, a set-top box, and the like.

In an embodiment, the client 710 may communicate with the solar panel 730 via network 720. Network 720 includes one or more networks, such as the Internet. In some embodiments of the present invention, network 720 may include one or more wide area networks (WAN) or local area networks (LAN). Network 720 may utilize one or more network technologies such as Ethernet, Fast Ethernet, Gigabit Ethernet, virtual private network (VPN), remote VPN access, a variant of IEEE 802.11 standard such as Wi-Fi, and the like. Communication over network 720 takes place using one or more network communication protocols including reliable streaming protocols such as transmission control protocol (TCP). These examples are illustrative and not intended to limit the present invention.

The solar panel 730 includes the controller 360. The controller 360 may be any type of processing (or computing) device as described above. For example, the controller 360 may be a workstation, mobile device, computer, cluster of computers, set-top box, or other computing device. In an embodiment, multiple modules may be implemented on the same computing device. Such a computing device may include software, firmware, hardware, or a combination thereof. Software may include one or more application on an operating system. Hardware can include, but is not limited to, a processor, memory, and/or graphical user interface display.

In an embodiment, the client 710 may communicate with the solar panel 730 via network 720 to instruct the solar panel 730 as to the appropriate actions to take based on the time of the day. For example, the client 710 may communicate with the solar panel 730 to instruct solar panel 730 to charge its batteries via the input AC power provided by the grid during times of the day in when the sunlight is not acceptable. In another example, the client 710 may communicate with the solar panel 730 via network 720 to instruct the solar panel 730 operate off of the DC power provided by the internal batteries included in the solar panel 730 during peak utility hours. In such an example, the client 710 may communicate with the solar panel 730 to charge its internal batteries from the solar energy captured by the solar panel 730 during off peak hours while the solar panel 730 relies on the input AC power provided by the grid. Then the client 710 may communicate with the solar panel 730 run off of its charged internal batteries during peak hours when the grid is stressed. In another embodiment, the client 710 may communicate with the solar panel 730 via network 720 to receive status updates of the solar panel 730.

In an embodiment, the solar panel 730 may include a GPS. The client 710 may communicate with the solar panel 730 via network 720 adjust the solar panel 730 to so that the solar panel 730 may face the sun at an angle that maximizes the solar energy captured by the solar panel 730. The client 710 may analyze the GPS coordinates of the solar panel 730 provided to the client 710 via the network 720. Based on the GPS coordinates of the solar panel 730 provided to the client 710, the client may adjust the solar panel 730 to face the sun at an angle that maximizes the solar energy captured by the solar panel 730.

In an embodiment, the solar panel 730 includes a tilt mechanism that is built into the back of the solar panel 730. The tilt mechanism may include a stepper motor that adjusts the solar panel 730 at an angle to face the sun that maximizes the solar energy captured by the solar panel 730 as the client 710 adjusts the solar panel 730 based on the GPS coordinates of the solar panel 730.

In an embodiment, the client 710 may remotely control the output AC power of the solar panel 730 via the network 720. The client 710 may dial back the output AC power of the solar panel 730 so that the DC power stored in the battery bank of the solar panel 730 is not depleted.

In an embodiment, the client 710 may obtain information regarding the solar panel 730 via the network 720 that may include but not limited to energy produced by the solar panel 730, energy consumed by the solar panel 730, the tilt of the solar panel 730, the angle of the solar panel 730, the GPS coordinates of the solar panel 730 and/or any other information regarding the solar panel 730 that may be communicated to the client 710 via the network 720 that will be apparent to those skilled in the relevant art(s) without departing from the spirit and scope of the disclosure.

An Exemplary Operational Control Flow of the Solar Panel

Figure 8:
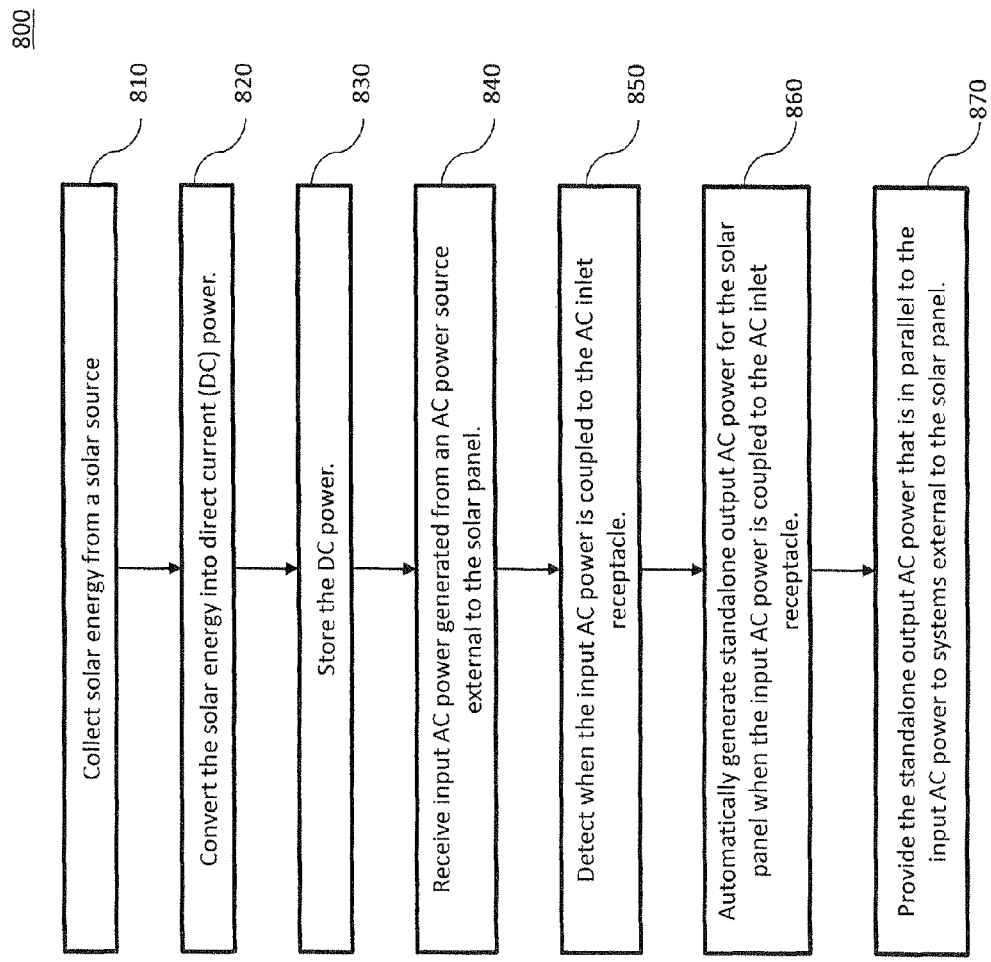
FIG. 8 is a flowchart of exemplary operational steps of the solar panel according to an exemplary embodiment of the present disclosure.

FIG. 8 is a flowchart of exemplary operational steps 800 of the solar panel according to an exemplary embodiment of the present disclosure. The present disclosure is not limited to this operational description. Rather, it will be apparent to persons skilled in the relevant art(s) from the teachings herein that other operational control flows are within the scope and spirit of the present disclosure. The following discussion describes the steps in FIG. 8

At step 810, the operational control flow collects solar energy from a solar source.

At step 820, the operational control flow converts the solar energy into direct current (DC) power. Specifically, the operational control flow converts the solar energy captured by a solar panel collector, such as the solar panel collector 310 to provide an example, into the DC power, such as converted DC power 305 to provide an example.

At step 830, the operational control flow stores the DC power.

At step 840, the operational control flow receives input AC power generated from an AC power source external to the solar panel. For example, the operational control flow receives input AC power 112 via the inlet AC receptacle 112 where the AC power 112 is generated by the grid.

At step 850, the operational control flow detects when the input AC power is coupled to the AC inlet receptacle.

At step 860, the operational control flow automatically generates standalone output AC power for the solar panel that is in parallel to the input AC power when the input AC power is coupled to the AC inlet receptacle.

At step 870, the standalone output AC power 195 that is in parallel to the input AC power 112 is provided to systems external to the solar panel.

CONCLUSION

It is to be appreciated that the Detailed Description section, and not the Abstract section, is intended to be used to interpret the claims. The Abstract section may set forth one or more, but not all exemplary embodiments, of the present disclosure, and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made without departing from the spirit and scope of the present disclosure. Thus the present disclosure should not be limited by any of the above-described exemplary embodiments, but should be defined only in accordance with the following claims and their equivalents.

What is claimed is:

1. A solar panel, comprising:
a solar power collector configured to collect solar energy from a solar source and to convert the solar energy into direct current (DC) power:
a current amplifier configured to amplify the DC power;
a battery bank configured to store the amplified DC power;
an alternating current (AC) inlet receptacle configured to receive input AC power generated from an AC power source external to the solar panel;
a power signal sensor configured to detect when the input AC power is coupled to the AC inlet receptacle;
a controller configured to automatically generate parallel output AC power for the solar panel when the input AC power is coupled to the AC inlet receptacle, wherein the parallel output AC power is generated from the input AC power and the DC power stored in the battery bank that is converted to AC power so that the converted AC power is in parallel to the input AC power; and
an AC outlet receptacle configured to provide the parallel output AC power to systems external to the solar panel.

2. The solar panel of claim 1, wherein the parallel output AC power is synchronized with the input AC power.

3. The solar panel of claim 2, wherein a plurality of power characteristics associated with the parallel output AC power is substantially equivalent to a plurality of power characteristics associated with the input AC power.

4. The solar panel of claim 2, wherein the parallel output AC power includes a sinusoidal wave that is substantially equivalent to the sinusoidal wave included in the input AC power.

5. The solar panel of claim 1, wherein the controller is further configured to automatically transition the parallel output AC power generated by the solar panel to standalone output AC power when the power signal sensor detects the input AC power coupled to the AC inlet receptacle.

6. The solar panel of claim 5, wherein the AC outlet receptacle is further configured to provide the standalone output AC power to the systems external to the solar panel when the power signal sensor no longer detects the input AC power coupled to the AC inlet receptacle, wherein the standalone output AC power is converted from the DC power stored in the battery bank of the solar panel.

7. The solar panel of claim 6, wherein the AC outlet receptacle is further configured to provide the standalone output AC power to systems external to the solar panel.

8. A method for generating parallel output alternating current (AC) power from a solar panel, comprising:
(a) collecting solar energy from a solar source:
(b) converting the solar energy into direct current (DC) power;
(c) amplifying the DC power;
(d) storing the amplified DC power;
(e) receiving input AC power generated from an AC power source external to the solar panel;
(f) detecting when the input AC power is coupled to the AC inlet receptacle;
(g) automatically generating parallel output AC power for the solar panel when the input AC power is coupled to the AC inlet receptacle, wherein the parallel output AC power is generated from the input AC power and the DC power stored in the battery bank that is converted to AC power so that the converted AC power is in parallel to the input AC power; and
(h) providing the parallel output AC power to systems external to the solar panel.

9. The method of claim 8, wherein the parallel output AC power is synchronized with the input AC power.

10. The method of claim 9, wherein a plurality of power characteristics associated with the parallel output AC power is substantially equivalent to a plurality of power characteristics associated with the input AC power.

11. The method of claim 9, wherein the parallel output AC power includes a sinusoidal wave that is substantially equivalent to the sinusoidal wave included in the input AC power.

12. The method of claim 8, further comprising:
automatically transitioning the parallel output AC power generated by the solar panel to standalone output AC power when the power signal sensor detects the input AC power coupled to the AC inlet receptacle.

13. The method of claim 12, further comprising:
providing the standalone output AC power to the systems external to the solar panel when the power signal sensor no longer detects the input AC power coupled to the AC inlet receptacle, wherein the standalone output AC power is converted from the DC power stored in the battery bank of the solar panel.

14. The method of claim 13, further comprising:
providing the standalone output AC power to systems external to the solar panel.

15. A solar panel configuration, comprising:
a plurality of solar panels configured to collect solar energy from a solar source and to convert the solar energy into direct current (DC) power;
a first solar panel included in the plurality of solar panels configured to:
automatically generate first standalone output AC power for the first solar panel when the first solar panel fails to detect first input AC power coupled to the first solar panel, wherein the first standalone output AC power is output AC power generated from the DC power of the first solar panel, and
act as a master solar panel when the first solar panel fails to detect the first input AC power coupled to the first solar panel, wherein the master solar panel automatically provides the first standalone output AC power to a slave solar panel included in the plurality of solar panels; and
a second solar panel included in the plurality of solar panels configured to:
automatically transition into generating second parallel output AC power, wherein the second parallel output AC power is second standalone output power generated by the second solar panel that is in parallel with the first standalone output AC power generated by the first solar panel, and
act as a slave solar panel when the second solar panel detects the first standalone output AC power provided by the first solar panel.

16. The solar panel configuration of claim 15, wherein the first standalone output AC power is synchronized with the second standalone output AC power.

17. The solar panel configuration of claim 16, wherein a plurality of power characteristics associated with the first standalone output AC power is substantially equivalent to a plurality of power characteristics associated with the input AC power.

18. The solar panel configuration of claim 16, wherein the first standalone output AC power includes a sinusoidal wave that is substantially equivalent to the sinusoidal wave included in the second standalone output AC power.

19. The solar panel configuration of claim 15, wherein the first solar panel is further configured to:
automatically transition to generating the first parallel output AC, wherein the first parallel output AC power is the first standalone output AC power generated by the first solar panel that is in parallel with the second input AC power when the first solar panel detects the second input AC power coupled to the first solar panel; and
act as the slave solar panel when the first solar panel detects the second input AC power coupled to the first solar panel.

20. The solar panel configuration of claim 15, wherein the second solar panel is further configured to:
automatically generate the second standalone output AC power for the second solar panel when the second solar panel fails to detect the first input AC power coupled to the second solar panel; and
act as a master solar panel when the second solar panel fails to detect the first input AC power coupled to the second solar panel, wherein the master solar panel automatically provides the second standalone output AC power to the slave solar panel included in the plurality of solar panels.

* * * * *

UNITED STATES PATENT AND TRADEMARK OFFICE
CERTIFICATE OF CORRECTION

PATENT NO. : 9,444,397 B2  
APPLICATION NO. : 13/843573  
DATED : September 13, 2016  
INVENTOR(S) : Christopher A. Estes Page 1 of 3

It is certified that error appears in the above-identified patent and that said Letters Patent is hereby corrected as shown below:

In the Specification

Column 1, Lines 45-46 read, "Each of the components included in ... are separate entities and not ..." and should read --Each of the components included in ... is a separate entity and not ...--

Column 3, Line 15 reads, "... memory devices, electrical optical, acoustical or other forms ..." and should read --...memory devices, electrical, optical, acoustical or other forms ...--

Column 7, Line 29 reads, "... each of the solar panels 100$a$ through 100$n$ operate ..." and should read --...each of the solar panels 100$a$ through 100$n$ operates ...--

Column 8, Lines 34-35 read, "... transition of the master when the slave solar panels 100$a$ through 100$n$ no longer senses input ..." and should read --transition of the master when the slave solar panels 100$a$ through 100$n$ no longer sense input--

Column 8, Lines 47-49 read, "... transition to the master when the slave solar panels 100a through 100n no longer senses input ..." and should read --... transition to the master when the slave solar panels 100a through 100n no longer sense input ...--

Column 9, Lines 5-6 read, "Although, FIG. 3 depicts a block diagram of the solar panel 300, one of ordinary skill ..." and should read --Although FIG. 3 depicts a block diagram of the solar panel 300, one of ordinary skill ...--

Column 9, Line 26 reads, "Each of which are enclosed within ..." and should read --Each of which is enclosed within ...--

Column 13, Line 40 reads, "Each of which are enclosed within ..." and should read --Each of which is enclosed within ...--

Signed and Sealed this  
Thirteenth Day of June, 2017

Joseph Matal  
*Performing the Functions and Duties of the*  
*Under Secretary of Commerce for Intellectual Property and*  
*Director of the United States Patent and Trademark Office*

CERTIFICATE OF CORRECTION (continued)
U.S. Pat. No. 9,444,397 B2

Column 14, Lines 34-35 read, "... through the first relay 410, and as shown by arrow 470, onto to the AC outlet receptacle ..." and should read --... through the first relay 410, and as shown by arrow 470, to the AC outlet receptacle ...--

Column 14, Line 53 reads, "In embodiment, the controller 360 ..." and should read --In an embodiment--

Column 15, Lines 4-5 read, "The first relay 410 and the second relay 420 may be implemented may be implemented in hardware, ..." and should read --The first relay 410 and the second relay 420 may be implemented in hardware, ...--

Column 15, Lines 19-20 read, "... recognize that features depicted in the block diagram of the solar panel 300 and 400 may also be included in ..." and should read --... recognize that features depicted in the block diagram of the solar panels 300 and 400 may also be included in ...--

Column 16, Lines 15-16 read, "The controller 360 may be a single or multiple processor based and may be able to ..." and should read --The controller 360 may be single or multiple processor based and may be able to ...--

Column 17, Line 17 reads, "Moreover, the solar panel 500 an AC coupling switch 555 ..." and should read --Moreover, the solar panel 500 includes an AC coupling switch 550--

Column 17, Lines 20-22 read, "... such that synchronized AC power from the AC inlet receptacle 330 and the solar panel 500 are coupled together for output from ..." and should read --... such that synchronized AC power from the AC inlet receptacle 330 and the solar panel 500 is coupled together for output from ...--

Column 18, Line 1 reads, "In an embodiment, the each of the ..." and should read --In an embodiment, each of the ...--

Column 18, Line 20 reads, "... to begin providing the converted AC power 660 the plurality ..." and should read --... to begin providing the converted AC power 660 to the plurality ...--

Column 18, Line 51 reads, "...phase, amplitude, voltage and/or current of the of the input ..." and should read --... phase, amplitude, voltage and/or current of the input--

Column 19, Lines 40-41 read, "... via network 720 to instruct the solar panel 730 operate off of the DC power ..." and should read --... via network 720 to instruct the solar panel 730 to operate off of the DC power ...--

Column 19, Line 48 reads, "... may communicate with the solar panel 730 run off of its ..." and should read --... may communicate with the solar panel 730 to run off of its--

Column 19, Line 55 reads, "... via network 720 adjust the solar panel 730 to so that the ..." and should read --... via network 720 to adjust the solar panel 730 so that the ...--

CERTIFICATE OF CORRECTION (continued)
U.S. Pat. No. 9,444,397 B2

Column 20, Lines 10-11 read, "... regarding the solar panel 730 via the network 720 that may include but not limited to energy produced by ..." and should read --... regarding the solar panel 730 via the network 720 that may include but is not limited to energy produced by ...--

Column 20, Line 27 reads, "... discussion describes the steps in FIG. 8" and should read --... discussion describes the steps in FIG. 8:--

Column 20, Lines 59-61 read, "The Abstract section may set forth one or more, but not all exemplary embodiments, of the present disclosure, and thus, are not intended to limit the ..." and should read --The Abstract section may set forth one or more, but not all, exemplary embodiments of the present disclosure, and thus is not intended to limit the ...--

In the Claims

Column 21, Line 15, Claim 1 reads, "... direct current (DC) power:" and should read --... direct current (DC) power;--

Column 21, Line 60, Claim 8 reads, "... (a) collecting solar energy from a solar source:" and should read --... (a) collecting solar energy from a solar source--

Column 23, Line 16, Claim 19 reads, "... output AC, wherein the first ..." and should read --... output AC power, wherein the first ...--